(12) United States Patent
Jain et al.

(10) Patent No.: US 12,431,944 B2
(45) Date of Patent: Sep. 30, 2025

(54) METHODS AND DEVICES FOR SELECTING A DESIRED SUB-HARMONIC OF A HIGH-FREQUENCY CLOCK

(71) Applicant: Intel Corporation, Santa Clara, CA (US)

(72) Inventors: Sanket Jain, Cedar Park, TX (US); Benjamin Jann, Portland, OR (US); Ashoke Ravi, Portland, OR (US); Satwik Patnaik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 416 days.

(21) Appl. No.: 17/763,209

(22) PCT Filed: Dec. 27, 2019

(86) PCT No.: PCT/US2019/068637
§ 371 (c)(1),
(2) Date: Mar. 24, 2022

(87) PCT Pub. No.: WO2021/133397
PCT Pub. Date: Jul. 1, 2021

(65) Prior Publication Data
US 2022/0337292 A1    Oct. 20, 2022

(51) Int. Cl.
*H04B 7/0413*    (2017.01)
*H04B 7/01*    (2006.01)
*H04B 7/26*    (2006.01)

(52) U.S. Cl.
CPC ............. *H04B 7/0413* (2013.01); *H04B 7/01* (2013.01); *H04B 7/265* (2013.01)

(58) Field of Classification Search
CPC ........ H04B 7/0413; H04B 7/01; H04B 7/265; H03D 2200/0086; H03D 7/165
See application file for complete search history.

(56) References Cited

U.S. PATENT DOCUMENTS 9,960,883 B1 * 5/2018 Chakraborty ........ H03D 7/1458
2005/0239430 A1   10/2005 Shah
(Continued)

FOREIGN PATENT DOCUMENTS

WO    2014035342 A1    3/2014

OTHER PUBLICATIONS

Extended European search report issued for the corresponding European patent application No. EP19957983.0, dated Aug. 9, 2023, 10 pages (for informational purposes only).
(Continued)

*Primary Examiner* — Ankur Jain
(74) *Attorney, Agent, or Firm* — Viering, Jentschura & Partner mbB

(57) ABSTRACT

A circuit for suppressing undesired sub-harmonics includes a plurality of mixers, wherein the plurality of mixers are connected in parallel; a plurality of local oscillator signals (LO), wherein each of the plurality of LOs is associated with one of the plurality of mixers; an input to receive a plurality of phases of a driving clock, wherein each of the plurality of phases is a sub-harmonic of the driving clock, and wherein each phase of the driving clock is distributed to one of the plurality of mixers; wherein the plurality of mixers are configured to suppress one or more of the plurality of phases of the driving clock and amplify a desired phase of the driving clock.

18 Claims, 11 Drawing Sheets

(56) References Cited

U.S. PATENT DOCUMENTS

| | | | |
|---|---|---|---|
| 2006/0160518 A1* | 7/2006 | Seendripu | H04B 1/26 |
| | | | 455/323 |
| 2007/0224964 A1 | 9/2007 | Kwon et al. | |
| 2008/0055009 A1* | 3/2008 | Lerner | H03B 21/00 |
| | | | 331/37 |
| 2013/0183921 A1 | 7/2013 | Mu et al. | |
| 2016/0261298 A1 | 9/2016 | Seendripu et al. | |
| 2017/0272062 A1* | 9/2017 | Lu | H03D 7/1458 |
| 2017/0366138 A1* | 12/2017 | Mu | H03D 7/1466 |

OTHER PUBLICATIONS

International Search Report issued for the corresponding international patent application No. PCT/US2019/068637, dated Sep. 25, 2020, 4 pages (for informational purposes only).

Dunworth, Jeremy D. et al., "A 28GHz Bulk-CMOS dual-polarization phased-array transceiver with 24 channels for 5G user and basestation equipment", 2018 IEEE International Solid-State Circuits Conference—(ISSCC), Feb. 11-15, 2018, 3 pages, IEEE, San Francisco, US.

Mazzanti, Andrea et al., "A 24GHz Sub-Harmonic Receiver Front-End with Integrated Multi-Phase LO Generation in 65nm CMOS", 2008 IEEE International Solid-State Circuits Conference, Digest of Technical Papers, Feb. 3-7, 2008, pp. 216, 217 and 608, IEEE, San Francisco, US.

Hittite Corporation, "Subharmonic vs. Fundamental Mixers for High Capacity Millimeterwave Radios", pp. 124-131, Chelmsford, US.

\* cited by examiner

For 5 Phases:

$$s(t - TLO/5) \overset{F}{\leftrightarrow} S(\omega)e^{-j\omega TLO/5}$$

$$i_{BB}(\omega) = iR_F(\omega) * S(\omega)$$

$$i_{BB}(\omega_{BB}) = \sum_{n=0}^{4} i_{RF}(\omega_{RF}) * S(\omega_{CLK} - n\,TLO/5)$$

$$\sum_{n=0}^{4} e^{-jn\omega TLO/5} = \frac{e^{-j\omega TLO} - 1}{e^{-j\omega TLO/5} - 1}$$

$\omega = \omega_{LO} \rightarrow 0$
$\omega = 3\omega_{LO} \rightarrow 0$
$\omega = 5\omega_{LO} \rightarrow 5$

METHODS AND DEVICES FOR SELECTING A DESIRED SUB-HARMONIC OF A HIGH-FREQUENCY CLOCK

RELATED APPLICATIONS

The present application is a national stage entry according to USC § 371 of PCT Application No. PCT/US2019/068637, filed on Dec. 27, 2019, which is incorporated by reference herein in its entirety.

TECHNICAL FIELD

Various aspects of the disclosure relate generally to methods and devices for identifying a desired phase of a sub-harmonic frequency from multiple sub-harmonic phases of a high frequency clock.

BACKGROUND

High frequency applications may require up-conversion and/or down-conversion of the high frequency radio frequency (RF). In the case of direct up-conversion and/or down-conversion, mixers used for high frequency applications require clock signal frequencies that are close to the frequency of the high frequency RF in order to avoid a heterodyne architecture. Distribution of high frequency clocks require high power consumption and a resonant circuit increasing the area and cost of the circuit.

Examples of high frequency applications include mm-Wave multiple-input/multiple-output (MIMO) and radar applications.

Each circuit may have a maximum frequency ($f_{MAX}$) corresponding to any power gain for a transistor. It may be difficult or impossible for a circuit to generate and distribute a frequency where the RF signal of interest is greater than its $f_{MAX}$. For example, in application and circuits in the THz range.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1A:
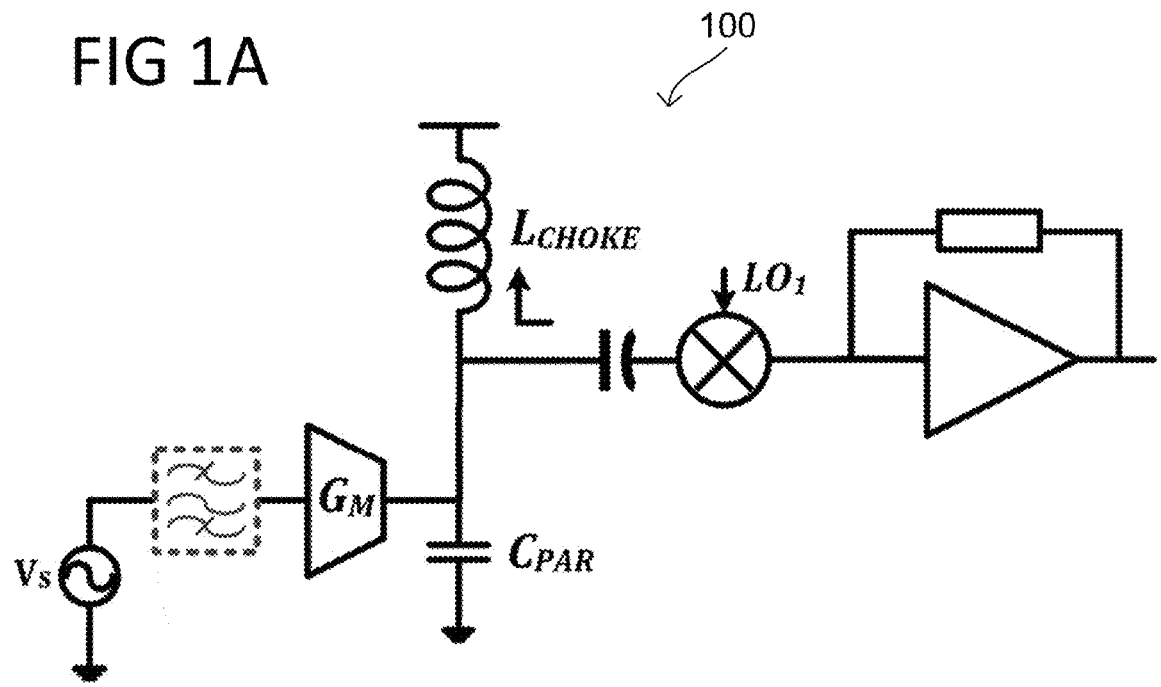
FIG. 1A shows a conventional current-mode mixer for down-converting an RF using a single phase of the RF according to some aspects.

The following detailed description refers to the accompanying drawings that show, by way of illustration, specific details and aspects of embodiments in which the invention may be practiced.

The word "exemplary" is used herein to mean "serving as an example, instance, or illustration." The words "plurality" and "multiple" in the description and claims refer to a quantity greater than one. The terms "group," "set", "sequence," and the like refer to a quantity equal to or greater than one. Any term expressed in plural form that does not expressly state "plurality" or "multiple" similarly refers to a quantity equal to or greater than one. The term "lesser subset" refers to a subset of a set that contains less than all elements of the set. Any vector and/or matrix notation utilized herein is exemplary in nature and is employed for purposes of explanation. Aspects of this disclosure described with vector and/or matrix notation are not limited to being implemented with vectors and/or matrices and the associated processes and computations may be performed in an equivalent manner with sets or sequences of data or other information.

As used herein, the term "software" refers to any type of executable instruction, including firmware.

Various aspects of this disclosure may utilize or be related to radio communication technologies. While some examples may refer to specific radio communication technologies, the examples provided herein may be similarly applied to various other radio communication technologies, both existing and not yet formulated, particularly in cases where such radio communication technologies share similar features as disclosed regarding the following examples. Various exemplary radio communication technologies that the aspects described herein may utilize include, but are not limited to: a Global System for Mobile Communications (GSM) radio communication technology, a General Packet Radio Service (GPRS) radio communication technology, an Enhanced Data Rates for GSM Evolution (EDGE) radio communication technology, and/or a Third Generation Partnership Project (3GPP) radio communication technology, for example Universal Mobile Telecommunications System (UMTS), Freedom of Multimedia Access (FOMA), 3GPP Long Term Evolution (LTE), 3GPP Long Term Evolution Advanced (LTE Advanced), Code division multiple access 2000 (CDMA2000), Cellular Digital Packet Data (CDPD), Mobitex, Third Generation (3G), Circuit Switched Data (CSD), High-Speed Circuit-Switched Data (HSCSD), Universal Mobile Telecommunications System (Third Generation) (UMTS (3G)), Wideband Code Division Multiple Access (Universal Mobile Telecommunications System) (W-CDMA (UMTS)), High Speed Packet Access (HSPA), High-Speed Downlink Packet Access (HSDPA), High-Speed Uplink Packet Access (HSUPA), High Speed Packet Access Plus (HSPA+), Universal Mobile Telecommunications System-Time-Division Duplex (UMTS-TDD), Time Division-Code Division Multiple Access (TD-CDMA), Time Division-Synchronous Code Division Multiple Access (TD-CDMA), 3rd Generation Partnership Project Release 8 (Pre-4th Generation) (3GPP Rel. 8 (Pre-4G)), 3GPP Rel. 9 (3rd Generation Partnership Project Release 9), 3GPP Rel. 10 (3rd Generation Partnership Project Release 10), 3GPP Rel. 11 (3rd Generation Partnership Project Release 11), 3GPP Rel. 12 (3rd Generation Partnership Project Release 12), 3GPP Rel. 13 (3rd Generation Partnership Project Release 13), 3GPP Rel. 14 (3rd Generation Partnership Project Release 14), 3GPP Rel. 15 (3rd Generation Partnership Project Release 15), 3GPP Rel. 16 (3rd Generation Partnership Project Release 16), 3GPP Rel. 17 (3rd Generation Partnership Project Release 17), 3GPP Rel. 18 (3rd Generation Partnership Project Release 18), 3GPP 5G, 3GPP LTE Extra, LTE-Advanced Pro, LTE Licensed-Assisted Access (LAA), MuLTEfire, UMTS Terrestrial Radio Access (UTRA), Evolved UMTS Terrestrial Radio Access (E-UTRA), Long Term Evolution Advanced (4th Generation) (LTE Advanced (4G)), cdmaOne (2G), Code division multiple access 2000 (Third generation) (CDMA2000 (3G)), Evolution-Data Optimized or Evolution-Data Only (EV-DO), Advanced Mobile Phone System (1st Generation) (AMPS (1G)), Total Access Communication arrangement/Extended Total Access Communication arrangement (TACS/ETACS), Digital AMPS (2nd Generation) (D-AMPS (2G)), Push-to-talk (PTT), Mobile Telephone System (MTS), Improved Mobile Telephone System (WITS), Advanced Mobile Telephone System (AMTS), OLT (Norwegian for Offentlig Landmobil Telefoni, Public Land Mobile Telephony), MTD (Swedish abbreviation for Mobiltelefonisystem D, or Mobile telephony system D), Public Automated Land Mobile (Autotel/PALM), ARP (Finnish for Autoradiopuhelin, "car radio phone"), NMT (Nordic Mobile Telephony), High capacity version of NTT (Nippon Telegraph and Telephone) (Hicap), Cellular Digital Packet Data (CDPD), Mobitex, DataTAC, Integrated Digital Enhanced Network (iDEN), Personal Digital Cellular (PDC), Circuit Switched Data (CSD), Personal Handyphone System (PHS), Wideband Integrated Digital Enhanced Network (WiDEN), iBurst, Unlicensed Mobile Access (UMA), also referred to as also referred to as 3GPP Generic Access Network, or GAN standard), Zigbee, Bluetooth®, Wireless Gigabit Alliance (WiGig) standard, mmWave standards in general (wireless systems operating at 10-300 GHz and above such as WiGig, IEEE 802.11ad, IEEE 802.11ay, etc.), technologies operating above 300 GHz and THz bands, (3GPP/LTE based or IEEE 802.11p and other) Vehicle-to-Vehicle (V2V) and Vehicle-to-X (V2X) and Vehicle-to-Infrastructure (V2I) and Infrastructure-to-Vehicle (I2V) communication technologies, 3GPP cellular V2X, DSRC (Dedicated Short Range Communications) communication arrangements such as Intelligent-Transport-Systems, and other existing, developing, or future radio communication technologies. As used herein, a first radio communication technology may be different from a second radio communication technology if the first and second radio communication technologies are based on different communication standards.

Unless explicitly specified, the term "transmit" encompasses both direct (point-to-point) and indirect transmission (via one or more intermediary points). Similarly, the term "receive" encompasses both direct and indirect reception. Furthermore, the terms "transmit", "receive", "communicate", and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as RF transceivers and antennas, and the logical transmission and reception over the software-level connection is performed by the processors or controllers.

Methods and devices described below are configured to generate low frequency clocks based on subharmonic phases of a high frequency RF. By using a subharmonic mixer architecture operating at a fraction of the high frequency RF, power consumption and area of a circuit associated with high frequency clock distribution may be reduced. Additionally, frequencies greater than $f_{MAX}$ may be processed, assuming the desired frequency has a fraction below $f_{MAX}$. For example, in a THz applications where a high frequency clock distribution is limited by $f_{MAX}$ considerations, a subharmonic mixer operating with LO clock frequency below the $f_{MAX}$ may be used to perform down-conversion.

A parallel switch of passive sub-harmonic mixers may be used to translate higher harmonics of RF signals with a frequency greater than $f_{MAX}$. The use of a parallel switch architecture may structurally eliminate spurious emissions in the case of a transmission (TX) and/or avoid down-converting undesired harmonics in the case of reception (RX) of a high frequency RF. The parallel switch architecture makes use of equally spaced LO phases driving of the gate of the mixer switches that are shorted at their drain and source.

The parallel switch architecture takes advantage of equally spaced phases of a high frequency RF to suppress unwanted mixing products, while translating the precise harmonic signal of the desired phase. The structure therefore facilitates use of low frequency clock generation and avoids the problems, such as distributing power hungry high frequency clocks. At the same time, the parallel switch architecture provides conversion gains for down-conversion and up-conversion operations. By arranging the mixers in parallel to create the switch, undesired, spurious harmonic frequency translation is suppressed without the need of filtering. This results in both cost and power savings for the circuit. The parallel architecture also lends itself for use in wideband architecture. In addition, the architecture is easily reconfigurable by switching to different multiplication factor allowing frequency translation to cover multiple bands.

Figure 1B:
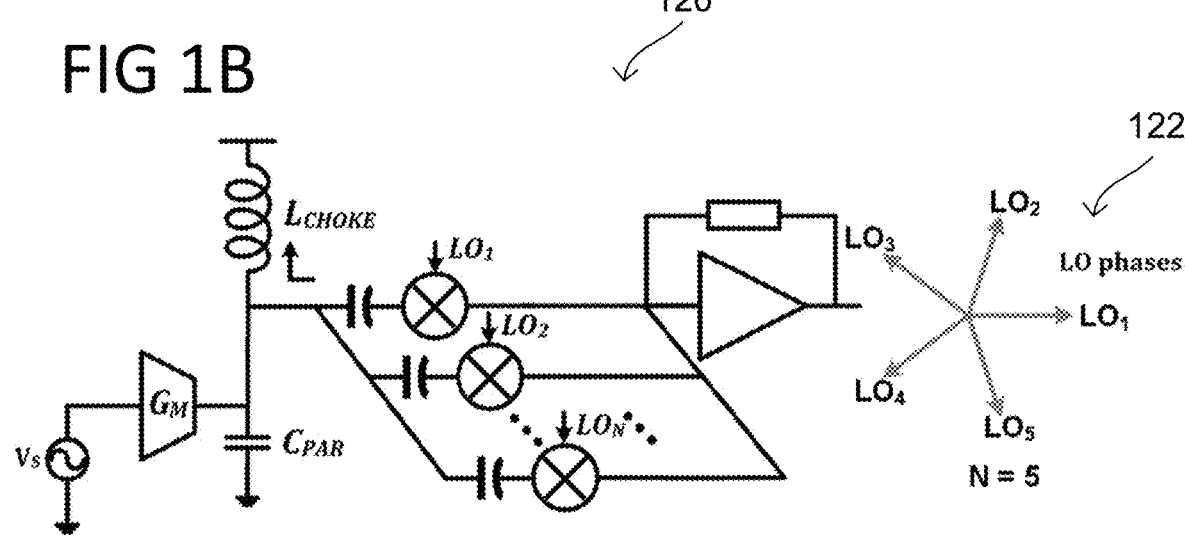
FIG. 1B shows an exemplary plurality of current-mode mixers for down-converting an RF using multiple phases of the RF according to some aspects.

FIGS. 1A and 1B highlight the difference between an single phase sub-harmonic architecture 100 shown in FIG. 1A and exemplary N-phase mixer equivalent 120 shown in FIG. 1B. The presence of multiple phases 122 (described in further detail below) down-converts the RF signal with phase offsets that are equally spaced in a 360 degree phase space.

Multiple phases of an RF signal are input into a parallel switch. The frequency of the RF signal is represented as N*ωLO, where N is any given number of phases. RF signal is down-converted at parallel switch and accompanied by a phase shifted LO to produce N baseband (BB) signals which are all directed toward the same direction.

Figure 2:
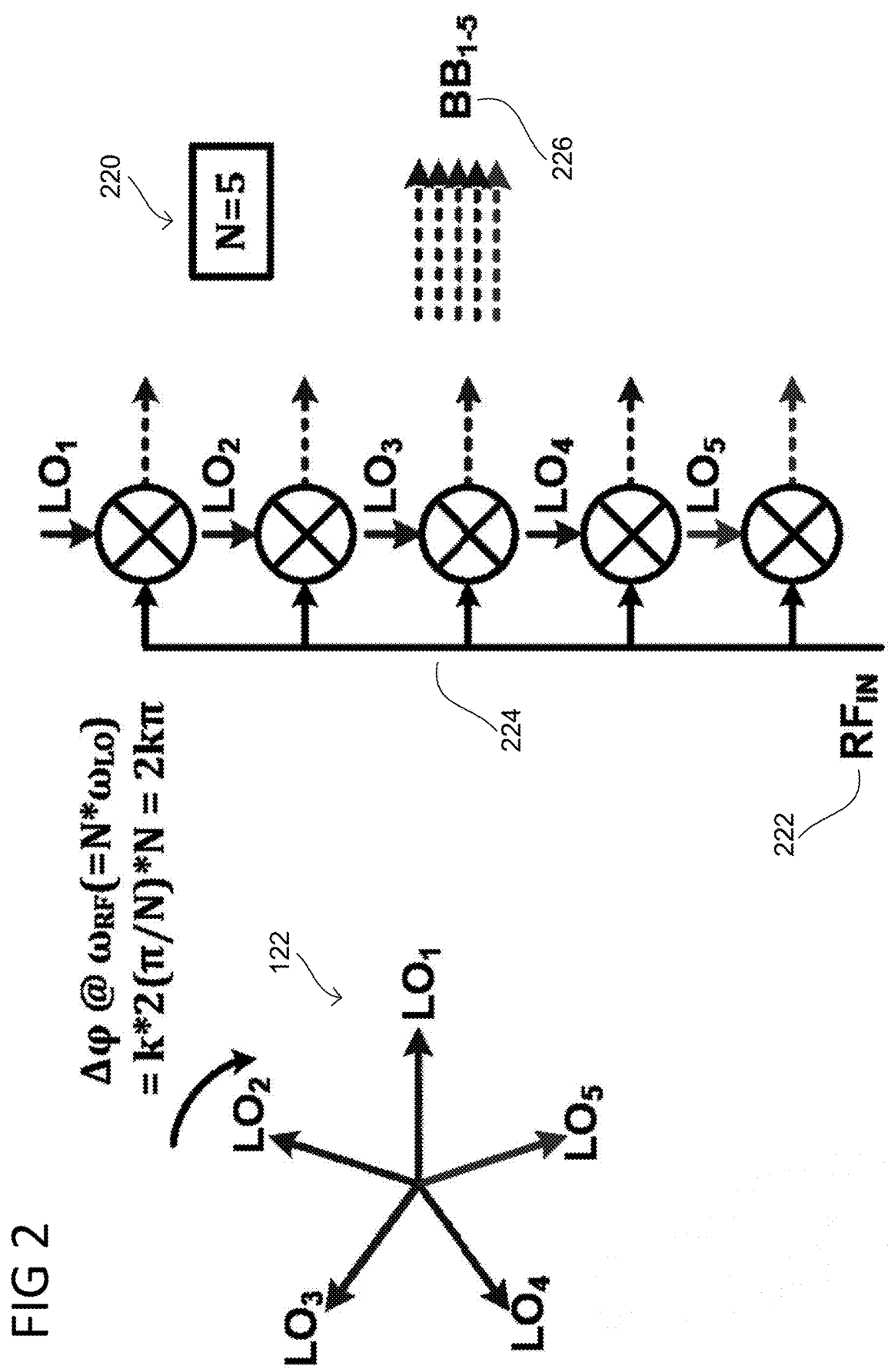
FIG. 2 shows an exemplary implementation of subharmonic mixers for five phases of an RF according to some aspects.

FIG. 2 shows multiple phases 122 of an RF signal 222, where the number of phases 220 N=5. With N-phase 220

LOs the target RF/mm Wave signal frequency is N times the frequency of the LO signal. For example, if the number of phases 220 is five, the target RF frequency is 5*ωLO. As shown in FIG. 2, RF 222 is input into parallel switch 224 at a frequency and down-converted. The down-converted signal is applied the mixers of the parallel mixer architecture 224 along with LO 122. Each LO is a phase shift of 2kπ, where k is an integer. The parallel mixer distributes down-converted RF signal and one of the phase LOs to each of mixers. Each mixer generates a BB 226 pointed in the same direction. For example, FIG. 2 depicts 5 BBs pointed in the +I direction of a quadrature implementation. It is important that the BBs are directed in the same direction in a differential I/Q implementation.

It is described in further detail below, how the parallel mixer mechanism analytically successfully suppresses unwanted harmonics except for the desired harmonic which is at N*ωLO.

It is assumed that phase generation is available as part of the input to the parallel mixer architecture. For example, in the case of an ultra-wideband RF. An example of phase generation using a DLL is shown.

Figure 3:
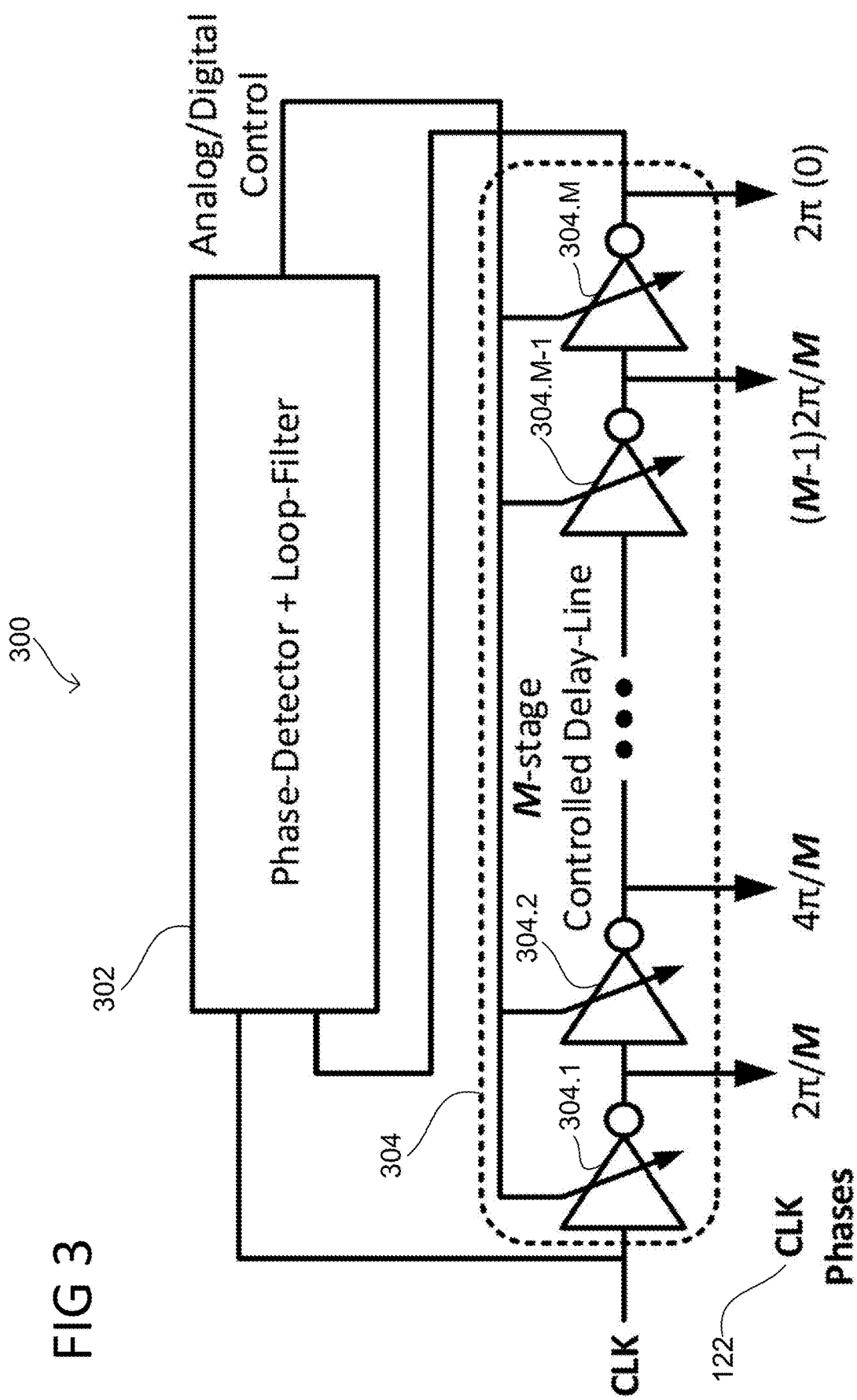
FIG. 3 shows an exemplary 5-phase harmonic generation scheme according to some aspects.

FIG. 3 depicts an exemplary delay locked loop (DLL) 300 used to generate equally spaced phases of a high frequency RF required as an input into the circuit 100. DLL 300 may be implemented as a multi-stage controlled delay-line. In an aspect, the DLL 300 may generate a multi-phase input to circuit 400 described in further detail below. Further in accordance with such aspects, the DLL 300 may include a phase-detector and loop filter 302, which may be implemented, for example, as one or more processors configured to execute computer-readable instructions to control a state of one or more of M number of delay elements 304.1-304.M included in the M-stage controlled delay-line 304. Although the M-stage controlled delay-line 304 is illustrated in FIG. 3 as implementing inverters as delay elements 304.1-304.M, aspects include the M-stage controlled delay-line 304 being implemented with any suitable type and/or combination of delay elements 304.1-304.M, such as buffers, for example.

In an aspect, phase-detector and loop filter 302 may facilitate analog and/or digital control over the M-stage controlled delay-line 304, which may be tuned to ensure that the delay-line input and output are separated by one clock period. The clock signal may include, for instance, the distributed input signal generated by a common phase locked loop (PLL). Furthermore, the phase-detector and loop filter 302 may control the state of the delay elements implemented by the M-stage controlled delay-line 304 using any suitable techniques, such as via load control, current starving control, power supply control, etc.

Aspects include DLL 300 generating phase-shifted signals, as shown in FIG. 3, separated by a phase that is a function of the number M of delay elements 304.1-304.M. Thus, the unit-phase granularity associated with an amount of phase-shift between the set of phase-shifted signals 122 provided by the DLL 300 (i.e., the "CLK Phases") is increased with the number M of delay elements 304.1-304.M. However, the DLL 300 is limited in that the unit phase-shift (2π/M) equivalent time-delay, in some instances, may decrease beyond a unit inverter delay of an individual delay element. Therefore, to allow for a finer granularity of unit-phase shift, aspects include implementing alternate types of delay lines.

Figure 4A:
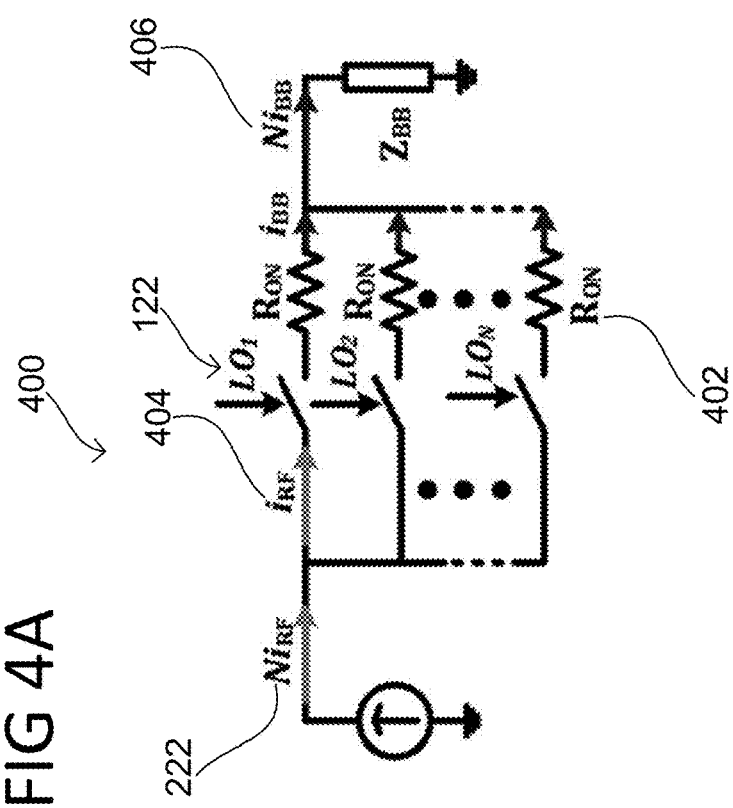
FIG. 4A shows an exemplary parallel switch according to some aspects.
Figure 4B:
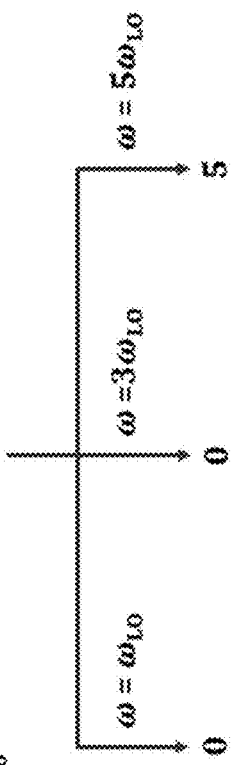
FIG. 4B demonstrates suppression of undesired harmonics according to some aspects.

FIG. 4A depicts another representation of the parallel switch architecture. Parallel switch 400 may include or consist of mixers 402 which are represented my resistors $R_{ON}$ in FIG. 4. High Frequency signal 222 ($Ni_{RF}$) is down converted to signal 404 ($i_{RF}$). Down converted signal 404 is distributed to each mixer 402. Phases 122 ($LO_{1-N}$), where N represents the number of phases, are also applied to each mixer 402. Each of the mixers 402 generate a baseband signal. The baseband signal components combine to form baseband 406 ($Ni_{BB}$), where baseband signal components for the undesired harmonics add up to 0 and only the desired harmonic remains. FIG. 4B shows formula 410 demonstrating analytically, for a 5-phase example, that this mechanism successfully rejects all unwanted harmonics except for the desired harmonic at N*ωLO.

The efficacy of suppression of unwanted mixing products depends on the matching between LO phases and the current/voltage commutating mixer devices. This matching can be ensured with careful and diligent layout techniques.

It should be noted that only odd numbered harmonics are addressed. Combining the thus creates a cancellation at LO/5 and its odd harmonics (3LO/5, 7LO/5, etc.), except the LO harmonics (LO, 3LO, etc.). This concept can be generalized mathematically such that if a number (2N+1) of phase clocks are combined, each being equally spaced by 2π/(2N+1) at a frequency of LO/(2N+1), the LO signals will coherently add at the LO frequency (and harmonics of LO), and will cancel out at all other odd harmonics of LO/(2N+1). In this case, N represents any integer. In other frequency-multiplication techniques (e.g., injection-locking or self-mixing), the sub-harmonics are not cancelled fundamentally, creating spurs that may occur within one or more critical frequency bands of interest. The use of this phase-additive technique to generate a higher-frequency LO signal using a much lower frequency may therefore be efficient.

Thus the parallel switch architecture facilitates sub-harmonic mixing without the need of explicit filtering for unwanted mixing products. This can be leveraged in more than one high frequency application. The structural spurious harmonic cancellation provided by the architecture for the unwanted mixing products makes the approach very attractive from a cost perspective. Applications ranging from high frequency radars (automotive arrays) and mm-Wave TRX for massive MIMO (including 5G and beyond) can benefit immensely from this approach. Additionally, the parallel switch architecture is inherently highly reconfigurable.

Figure 5:
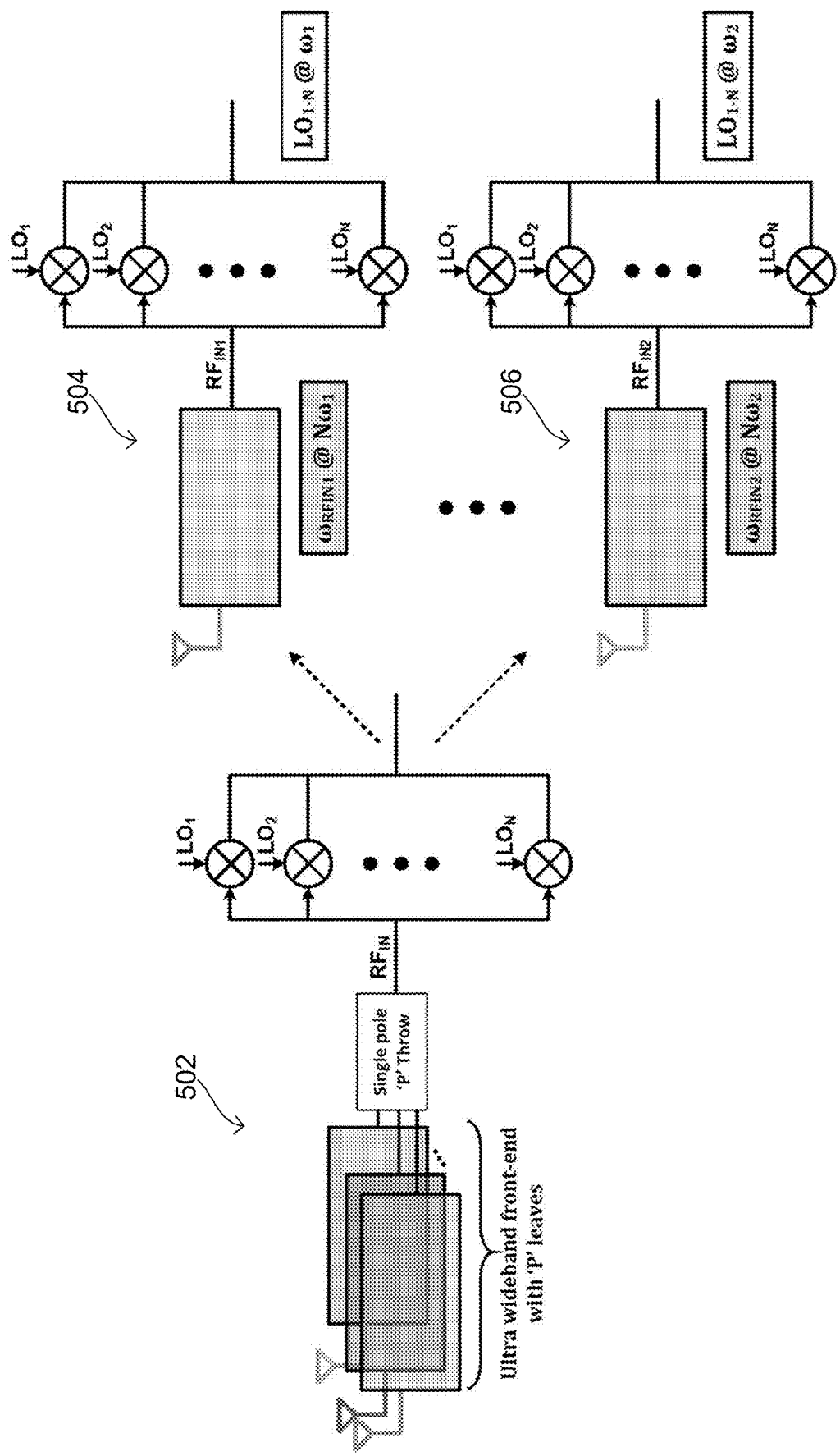
FIG. 5 shows an exemplary implementation of a parallel switch within a wideband architecture according to some aspects.

For example, the parallel switch architecture may be configured for ultra-wideband systems. Assuming that wide-band phase generation (as described above) is available, sub-harmonic mixers can be connected in parallel to span multiple bands as shown in FIG. 5. Ultra-wideband system 502, which includes a parallel switch of sub-harmonic mixers 224, operating at first band can distribute a signal to other ultra-wideband systems 504 and 506. Ultra-wideband system 504 may operate at a band different both ultra-wideband systems 502 and 504. Ultra-wideband systems 504 and 506 are shown to include a parallel switch of sub-harmonic mixers 224, but ultra-wideband system 502 may share a signal with an ultra-wideband system that does not include a parallel switch of sub-harmonic mixers 224. An effect of this approach becomes even more evident when we consider the fact that harmonic suppression of unwanted mixing products obviates the need for additional filtering at RF. This can bring significant cost savings.

Figure 6:
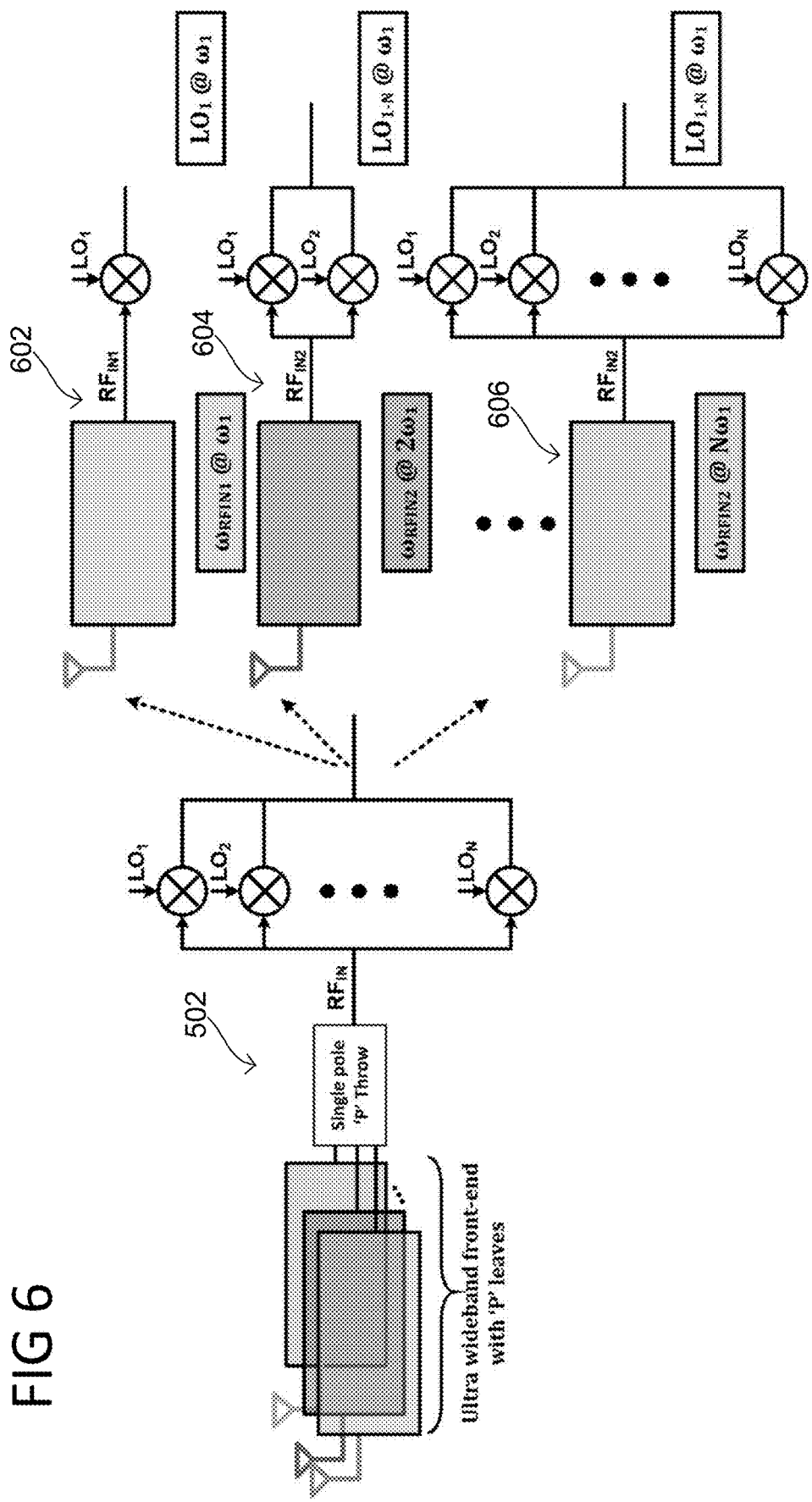
FIG. 6 shows an exemplary implementation of a parallel switch within a wideband architecture across multiple harmonics according to some aspects.

As another example, the parallel switch of sub-harmonic mixers 224 may be re-configured across multiple harmonics of the LO frequency as shown in FIG. 6. Ultra-wideband system 502 may distribute a signal to ultra-wideband systems 602, 604, and 606 employing a variable number of mixers. As shown, system 602 only uses one mixer and system 604 uses two mixers. This means that the system can be shared across bands spanning from a frequency of $\omega_{LO}$ to $k*\omega_{LO}$, where k is an odd integer (k=1, 3, . . . , N). This has the potential of resource sharing across sub-6 to mm-Wave 5G applications.

Figure 7A:
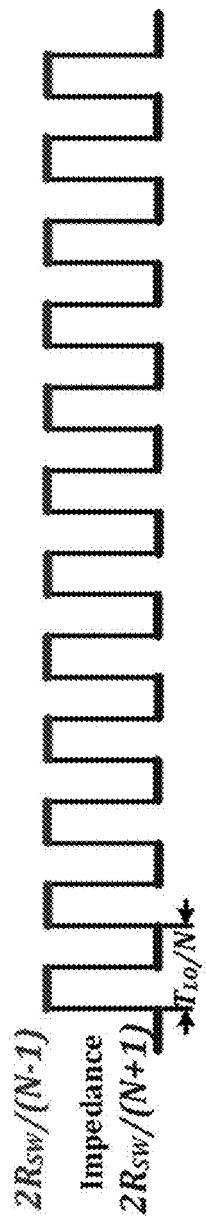
FIGS. 7A and 7B show exemplary impedance modulation waveforms for an odd number of phases according to some aspects.
Figure 7B:
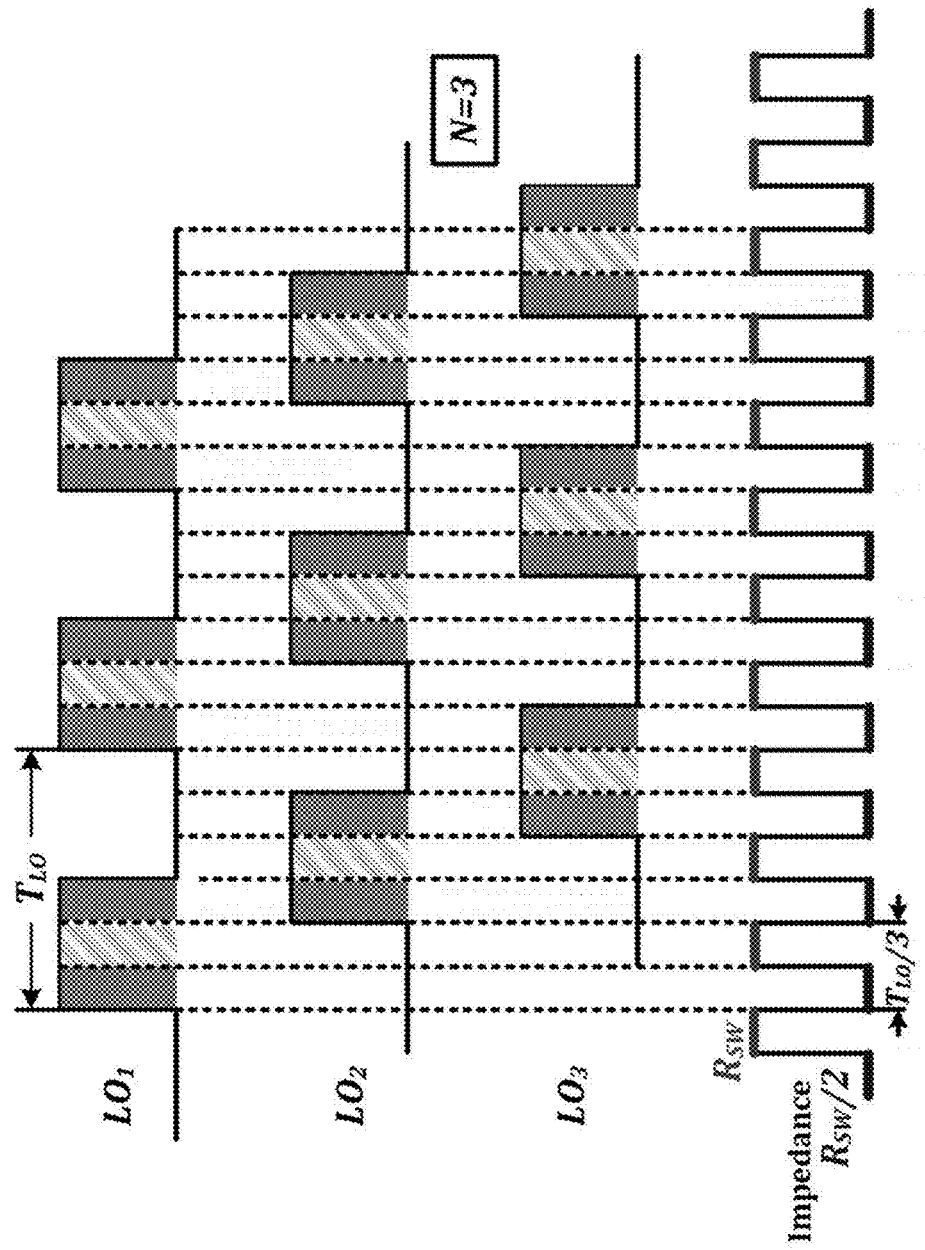

FIGS. 7A and 7B show exemplary impedance modulation waveforms for an odd number of phases. FIG. 7A shows a general impedance modulation waveform for N number of phases. FIG. 7B shows impedance modulation waveforms at a desired harmonic frequency for N=3 phases.

Figure 8:
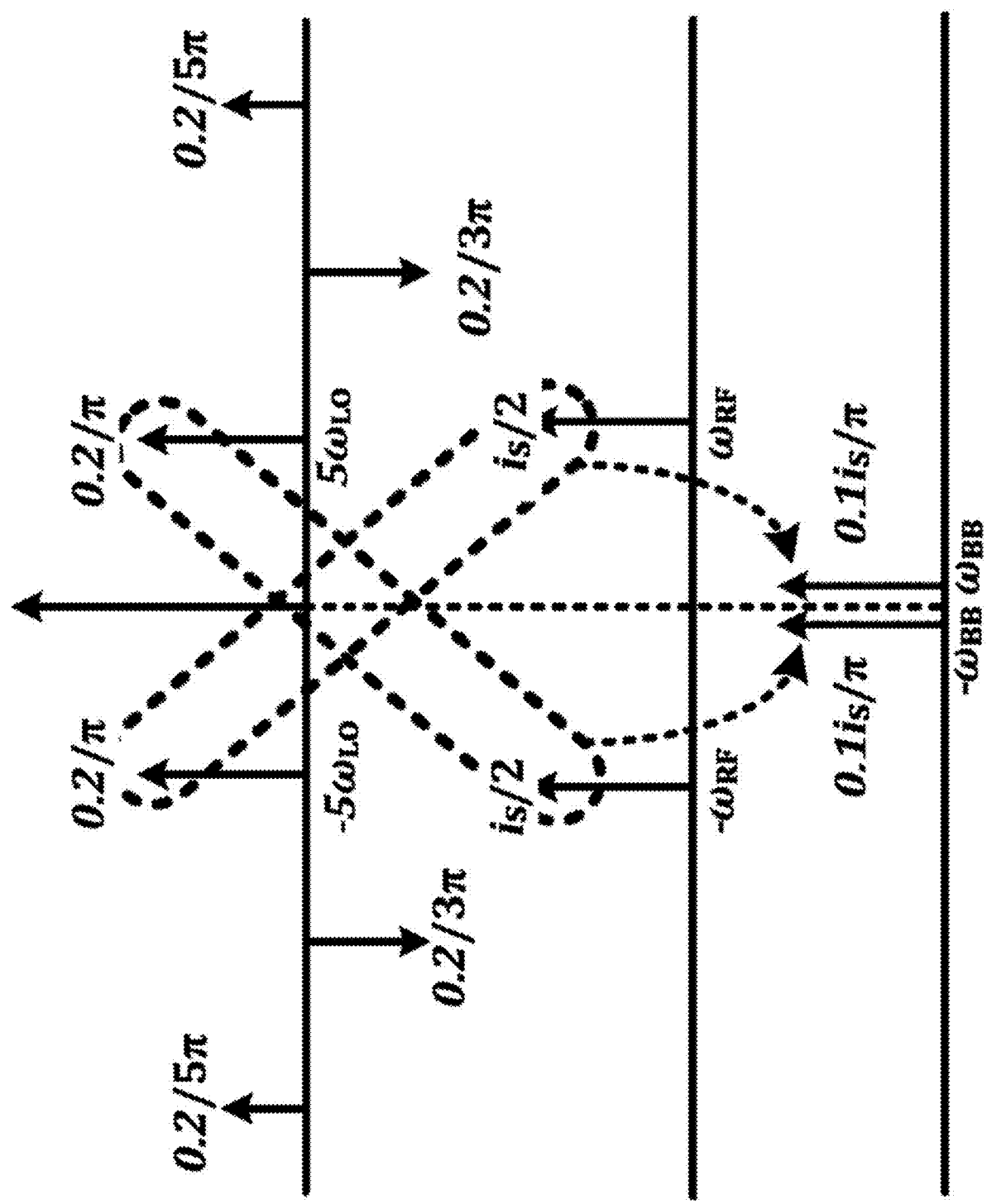
FIG. 8 shows an exemplary frequency spectra with conversion gains for a down-conversion operation according to some aspects.

FIG. 8 shows the frequency spectra of a parallel switch architecture operating at five phases N=5 and its conversion gains for a down conversion operation.

Figure 9:
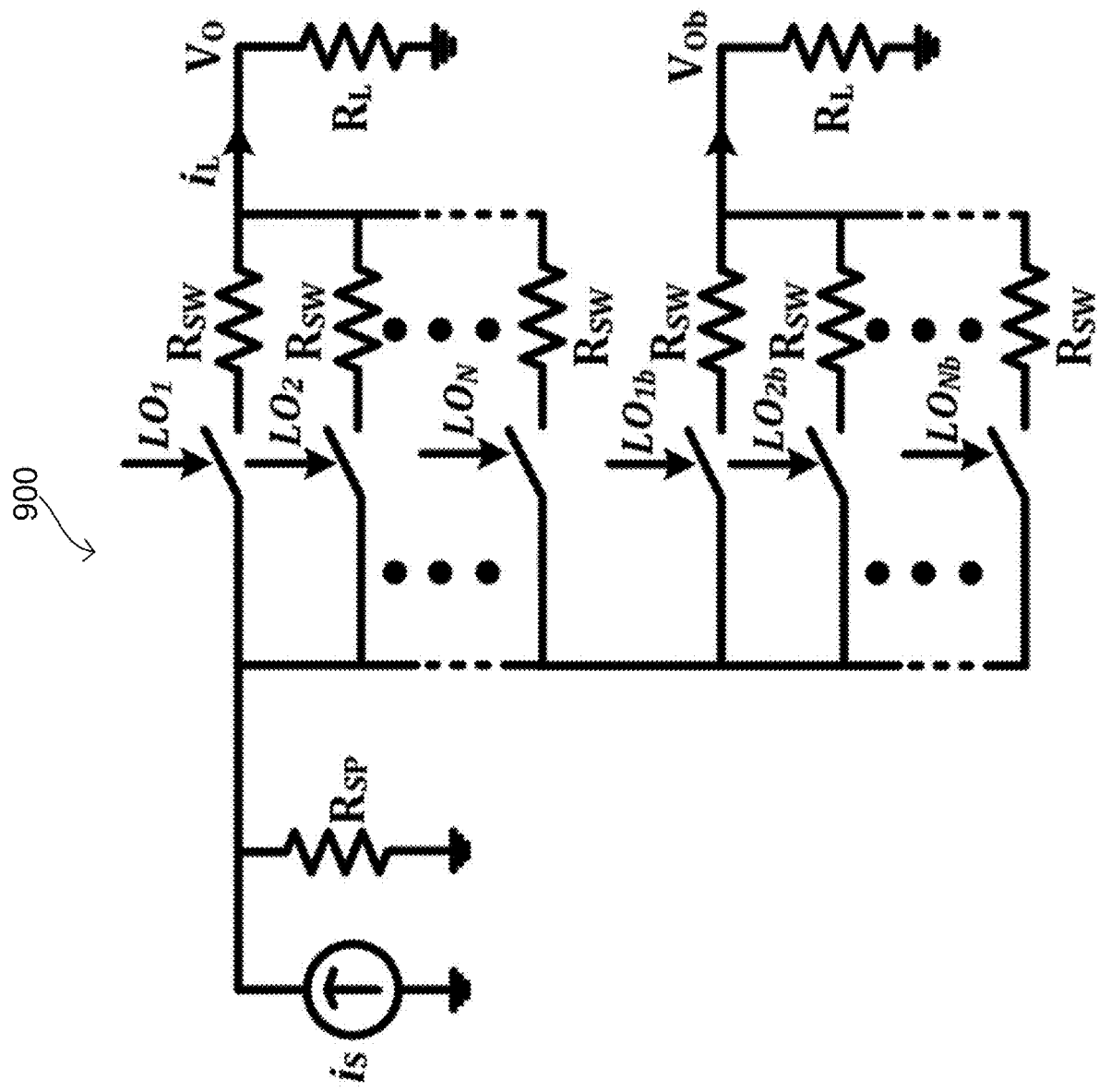
FIG. 9 shows an exemplary differential model of the parallel switch architecture according to some aspects.

FIG. 9 circuit 900 is a differential model of subharmonic mixers.

Figure 10B:
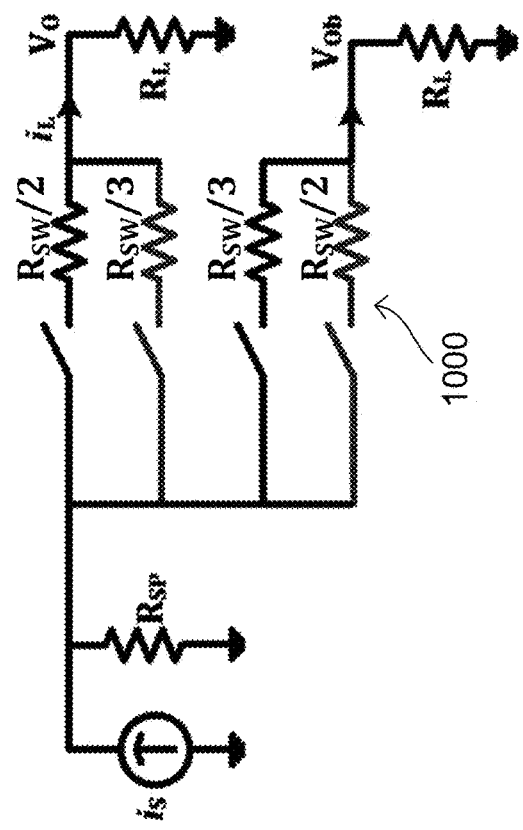
FIGS. 10A and 10B shows a constant input impedance across local oscillator (LO) phases in a differential model of the parallel switch architecture according to some aspects.
Figure 10A:
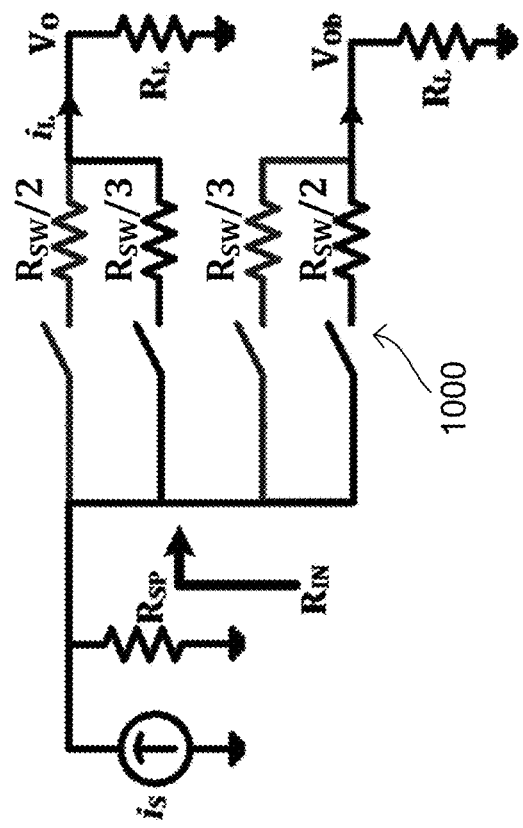

FIGS. 10A and 10B are examples of differential circuit 900 and demonstrate constant input impedance across LO phases. For example, FIG. 10A shows circuit 1000 impedance for a first phase and FIG. 10B shows impedance for circuit 1000 at a second phase.

Figure 11:
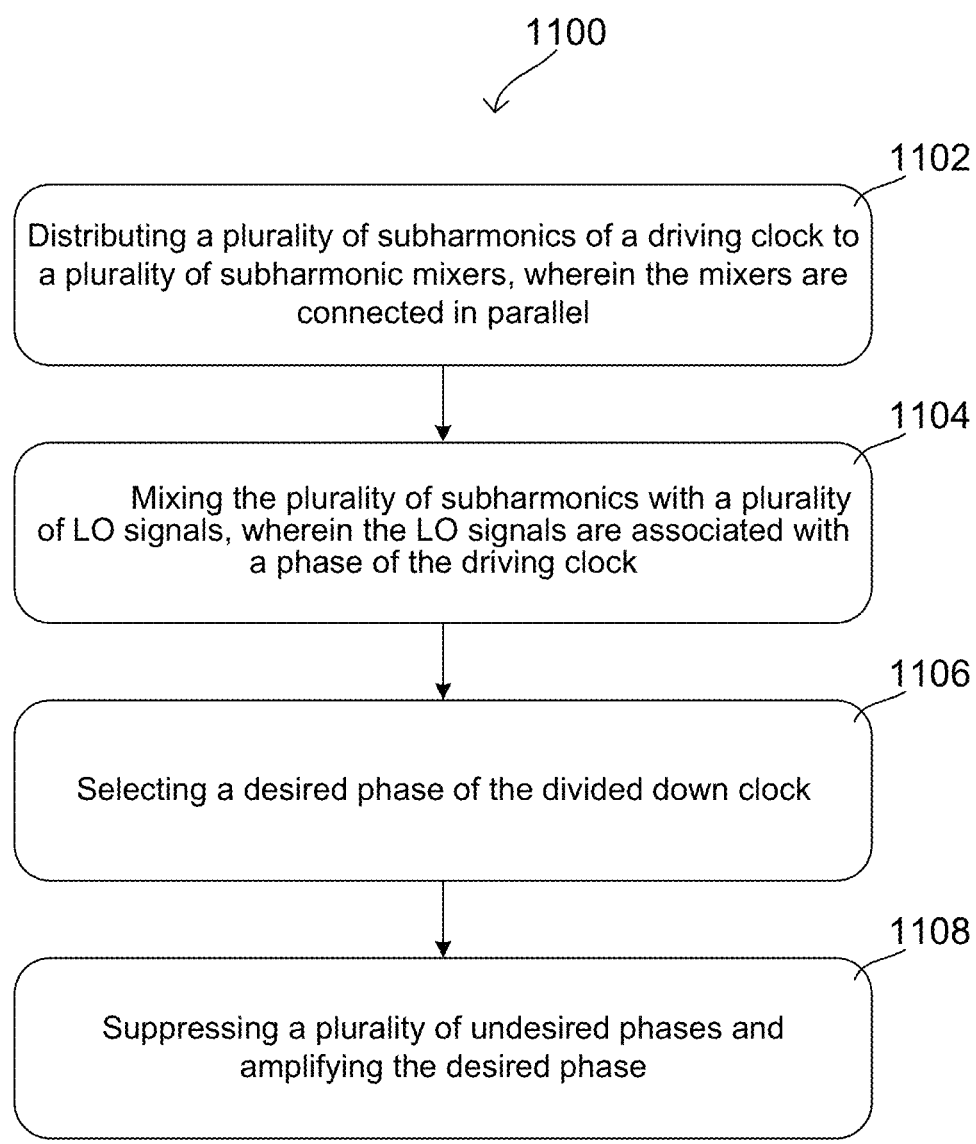
FIG. 11 shows a method for suppressing undesired harmonics of a high frequency RF

FIG. 11 depicts an exemplary method 1100 of generating a synthesized clock. As shown in FIG. 11, method 1100 includes distributing a plurality of subharmonics of a driving clock to a plurality of subharmonic mixers, wherein the mixers are connected in parallel (1102), mixing the plurality of subharmonics with a plurality of LO signals, wherein the LO signals are associated with a phase of the driving clock (1104), selecting a desired phase of the divided down clock (1106), suppressing a plurality of undesired phases and amplifying the desired phase (1108).

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

The following examples disclose various aspects of this disclosure:

Example 1 is a circuit for suppressing undesired subharmonics including a plurality of mixers, wherein the plurality of mixers are connected in parallel; a plurality of local oscillator signals (LO), wherein each of the plurality of LOs is associated with one of the plurality of mixers; an input to receive a plurality of phases of a driving clock, wherein each of the plurality of phases is a sub-harmonic of the driving clock, and wherein each phase of the driving clock is distributed to one of the plurality of mixers; wherein the plurality of mixers are configured to suppress one or more of the plurality of phases of the driving clock and amplify a desired phase of the driving clock.

In example 2, the subject matter of Example 1, can optionally further include wherein the plurality of mixers are reconfigurable.

In example 3, the subject matter of any of Examples 1 and 2 can optionally further include, wherein the plurality of mixers are configured up-convert the desired phase of the driving clock.

In example 4, the subject matter of any of Examples 1-3, can optionally further include wherein the plurality of mixers are configure to down-convert the desired phase of the driving clock.

In example 5, the subject matter of any of Examples 1-4, can optionally further include wherein the circuit is part of a high-frequency transceiver chain.

In example 6, the subject matter of any of Examples 1-5, can optionally further include wherein the circuit is part of a multiple-input/multiple-output (MIMO) transceiver chain.

In example 7, the subject matter of any of Examples 1-6, can optionally further include wherein the driving clock is a radar signal.

In example 8, the subject matter of any of Examples 1-7, can optionally further include wherein the driving an mm-Wave signal.

In example 9, the subject matter of any of Examples 1-8, can optionally further include a maximum frequency.

In example 10, the subject matter of any of Examples 1-9, can optionally further include wherein a frequency of each of the plurality of phases is less than a maximum frequency.

In example 11, the subject matter of any of Examples 1-10, can optionally further include wherein the plurality of mixers are passive mixers.

In example 12, the subject matter of any of Examples 1-11, can optionally further include wherein a gate of each of the plurality of mixers is shorted at its drain and at its source.

In example 13, the subject matter of any of Examples 1-12, can optionally further include wherein the plurality of phases is equally spaced within a 360 degree phase space.

In example 14, the subject matter of any of Examples 1-13, can optionally further include wherein a frequency of a driving clock is greater than the maximum frequency of the circuit.

In example 15, the subject matter of any of Examples 1-14, can optionally further include wherein the plurality of mixers, generates a plurality of outputs that are directed in the same direction, wherein each of the plurality of outputs is based on one of the plurality of phases.

In example 16, the subject matter of any of Examples 1-15, can optionally further include wherein the plurality of outputs includes one or more undesired outputs and one desired output based on the desired phase of the driving clock.

In example 17, the subject matter of any of Examples 1-16, can optionally further include wherein the one or more undesired outputs combine to 0.

In example 18, the subject matter of any of Examples 1-17, can optionally further include wherein the desired output is amplified.

In example 19, the subject matter of any of Examples 1-18, can optionally further include wherein the driving clock is a radar signal.

In example 20, the subject matter of any of Examples 1-19, can optionally further include wherein the driving clock is a mm-Wave signal.

Example 21 is a system for suppressing undesired sub-harmonics including a plurality of mixers, wherein the plurality of mixers are connected in parallel; a plurality of local oscillator signals (LO), wherein each of the plurality of LOs is associated with one of the plurality of mixers; an input to receive a plurality of phases of a driving clock, wherein each of the plurality of phases is a sub-harmonic of the driving clock, and wherein each phase of the driving clock is distributed to one of the plurality of mixers; wherein the plurality of mixers are configured to suppress one or more of the plurality of phases of the driving clock and amplify a desired phase of the driving clock.

In example 22, the subject matter of Example 21, can optionally further include wherein the plurality of mixers are reconfigurable.

In example 23, the subject matter of any of Examples 21 and 22 can optionally further include, wherein the plurality of mixers are configured up-convert the desired phase of the driving clock.

In example 24, the subject matter of any of Examples 21-23, can optionally further include wherein the plurality of mixers are configure to down-convert the desired phase of the driving clock.

In example 25, the subject matter of any of Examples 21-24, can optionally further include wherein the system is part of a high-frequency transceiver chain.

In example 26, the subject matter of any of Examples 21-25, can optionally further include wherein the system is part of a multiple-input/multiple-output (MIMO) transceiver chain.

In example 27, the subject matter of any of Examples 21-26, can optionally further include wherein the driving clock is a radar signal.

In example 28, the subject matter of any of Examples 21-27, can optionally further include wherein the driving an mm-Wave signal.

In example 29, the subject matter of any of Examples 21-28, can optionally further include a maximum frequency.

In example 30, the subject matter of any of Examples 21-29, can optionally further include wherein a frequency of each of the plurality of phases is less than a maximum frequency.

In example 31, the subject matter of any of Examples 21-30, can optionally further include wherein the plurality of mixers are passive mixers.

In example 32, the subject matter of any of Examples 21-31, can optionally further include wherein a gate of each of the plurality of mixers is shorted at its drain and at its source.

In example 33, the subject matter of any of Examples 21-32, can optionally further include wherein the plurality of phases is equally spaced within a 360 degree phase space.

In example 34, the subject matter of any of Examples 21-33, can optionally further include wherein a frequency of a driving clock is greater than the maximum frequency of the system.

In example 35, the subject matter of any of Examples 21-34, can optionally further include wherein the plurality of mixers, generates a plurality of outputs that are directed in the same direction, wherein each of the plurality of outputs is based on one of the plurality of phases.

In example 36, the subject matter of any of Examples 21-35, can optionally further include wherein the plurality of outputs includes one or more undesired outputs and one desired output based on the desired phase of the driving clock.

In example 37, the subject matter of any of Examples 21-36, can optionally further include wherein the one or more undesired outputs combine to 0.

In example 38, the subject matter of any of Examples 21-37, can optionally further include wherein the desired output is amplified.

In example 39, the subject matter of any of Examples 21-38, can optionally further include wherein the driving clock is a radar signal.

In example 40, the subject matter of any of Examples 21-39, can optionally further include wherein the driving clock is a mm-Wave signal.

Example 41 is a means for suppressing undesired sub-harmonics including a plurality of mixers, wherein the plurality of mixers are connected in parallel; a plurality of local oscillator signals (LO), wherein each of the plurality of LOs is associated with one of the plurality of mixers; an input to receive a plurality of phases of a driving clock, wherein each of the plurality of phases is a sub-harmonic of the driving clock, and wherein each phase of the driving clock is distributed to one of the plurality of mixers; wherein the plurality of mixers are configured to suppress one or more of the plurality of phases of the driving clock and amplify a desired phase of the driving clock.

In example 42, the subject matter of Example 41, can optionally further include wherein the plurality of mixers are reconfigurable.

In example 43, the subject matter of any of Examples 41 and 42 can optionally further include, wherein the plurality of mixers are configured up-convert the desired phase of the driving clock.

In example 44, the subject matter of any of Examples 41-43, can optionally further include wherein the plurality of mixers are configure to down-convert the desired phase of the driving clock.

In example 45, the subject matter of any of Examples 41-44, can optionally further include wherein the means is part of a high-frequency transceiver chain.

In example 46, the subject matter of any of Examples 41-45, can optionally further include wherein the means is part of a multiple-input/multiple-output (MIMO) transceiver chain.

In example 47, the subject matter of any of Examples 41-46, can optionally further include wherein the driving clock is a radar signal.

In example 48, the subject matter of any of Examples 41-47, can optionally further include wherein the driving an mm-Wave signal.

In example 49, the subject matter of any of Examples 41-48, can optionally further include a maximum frequency.

In example 50, the subject matter of any of Examples 41-49, can optionally further include wherein a frequency of each of the plurality of phases is less than a maximum frequency.

In example 51, the subject matter of any of Examples 41-50, can optionally further include wherein the plurality of mixers are passive mixers.

In example 52, the subject matter of any of Examples 41-51, can optionally further include wherein a gate of each of the plurality of mixers is shorted at its drain and at its source.

In example 53, the subject matter of any of Examples 41-52, can optionally further include wherein the plurality of phases is equally spaced within a 360 degree phase space.

In example 54, the subject matter of any of Examples 41-53, can optionally further include wherein a frequency of a driving clock is greater than the maximum frequency of the means.

In example 55, the subject matter of any of Examples 41-54, can optionally further include wherein the plurality of mixers, generates a plurality of outputs that are directed in the same direction, wherein each of the plurality of outputs is based on one of the plurality of phases.

In example 56, the subject matter of any of Examples 41-55, can optionally further include wherein the plurality of outputs includes one or more undesired outputs and one desired output based on the desired phase of the driving clock.

In example 57, the subject matter of any of Examples 41-56, can optionally further include wherein the one or more undesired outputs combine to 0.

In example 58, the subject matter of any of Examples 41-57, can optionally further include wherein the desired output is amplified.

In example 59, the subject matter of any of Examples 41-58, can optionally further include wherein the driving clock is a radar signal.

In example 60, the subject matter of any of Examples 41-59, can optionally further include wherein the driving clock is a mm-Wave signal.

Example 61 is a method for suppressing undesired sub-harmonics including distributing a plurality of subharmonics of a driving clock to a plurality of subharmonic mixers, wherein the mixers are connected in parallel; mixing the plurality of subharmonics with a plurality of LO signals, wherein the LO signals are associated with a phase of the driving clock; selecting a desired phase of the divided down clock; and suppressing a plurality of undesired phases and amplifying the desired phase.

In example 62, the subject matter of Example 61, can optionally further include wherein the plurality of mixers are reconfigurable.

In example 63, the subject matter of any of Examples 61 and 62 can optionally further include, wherein the plurality of mixers are configured up-convert the desired phase of the driving clock.

In example 64, the subject matter of any of Examples 61-63, can optionally further include wherein the plurality of mixers are configure to down-convert the desired phase of the driving clock.

In example 65, the subject matter of any of Examples 61-64, can optionally further include wherein the method is part of a high-frequency transceiver chain.

In example 66, the subject matter of any of Examples 61-65, can optionally further include wherein the method is part of a multiple-input/multiple-output (MIMO) transceiver chain.

In example 67, the subject matter of any of Examples 61-66, can optionally further include wherein the driving clock is a radar signal.

In example 68, the subject matter of any of Examples 61-67, can optionally further include wherein the driving an mm-Wave signal.

In example 69, the subject matter of any of Examples 61-68, can optionally further include a maximum frequency.

In example 70, the subject matter of any of Examples 61-69, can optionally further include wherein a frequency of each of the plurality of phases is less than a maximum frequency.

In example 71, the subject matter of any of Examples 61-70, can optionally further include wherein the plurality of mixers are passive mixers.

In example 72, the subject matter of any of Examples 61-71, can optionally further include wherein a gate of each of the plurality of mixers is shorted at its drain and at its source.

In example 73, the subject matter of any of Examples 61-72, can optionally further include wherein the plurality of phases is equally spaced within a 360 degree phase space.

In example 74, the subject matter of any of Examples 61-73, can optionally further include wherein a frequency of a driving clock is greater than the maximum frequency of the method.

In example 75, the subject matter of any of Examples 61-74, can optionally further include wherein the plurality of mixers, generates a plurality of outputs that are directed in the same direction, wherein each of the plurality of outputs is based on one of the plurality of phases.

In example 76, the subject matter of any of Examples 61-75, can optionally further include wherein the plurality of outputs includes one or more undesired outputs and one desired output based on the desired phase of the driving clock.

In example 77, the subject matter of any of Examples 61-76, can optionally further include wherein the one or more undesired outputs combine to 0.

In example 78, the subject matter of any of Examples 61-77, can optionally further include wherein the desired output is amplified.

In example 79, the subject matter of any of Examples 61-78, can optionally further include wherein the driving clock is a radar signal.

In example 80, the subject matter of any of Examples 61-79, can optionally further include wherein the driving clock is a mm-Wave signal.

Example 81 is a non-transitory computer readable medium storing instructions thereon, that when executed by one or more processors of circuit, cause the circuit to perform the method of any one of Examples 61 to 80.

What is claimed is:

1. A circuit for suppressing undesired sub-harmonics comprising:
   a plurality of mixers, wherein mixers of the plurality of mixers are connected in parallel;
   a plurality of local oscillator signals (LO), wherein each of the plurality of LOs is associated with a phase of a driving clock and one of the plurality of mixers;
   an input to receive a plurality of phases of the driving clock, wherein each of the plurality of phases is equally spaced within a 360 degree phase space, and wherein each phase of the driving clock is distributed to one of the plurality of mixers; and
   wherein the plurality of mixers is configured to suppress one or more of a plurality of undesired phases of the driving clock and amplify a desired phase of the driving clock and to generate baseband signal components directed in a same direction, each of the components based on one of the plurality of phases and wherein the components are added to form a baseband signal.

2. The circuit of claim 1, wherein the plurality of mixers is reconfigurable.

3. The circuit of claim 2, wherein the plurality of mixers is configured up-convert the desired phase of the driving clock.

4. The circuit of claim 2, wherein the plurality of mixers is configured to down-convert the desired phase of the driving clock.

5. The circuit of claim 2, wherein the circuit is part of a high-frequency transceiver chain.

6. The circuit of claim 2, wherein the circuit is part of a multiple-input/multiple-output (MIMO) transceiver chain.

7. The circuit of claim 2, wherein the driving clock is a radar signal.

8. The circuit of claim 2, wherein the driving clock is a mm-Wave signal.

9. The circuit of claim 2, further comprising a maximum frequency.

10. The circuit of claim 9, wherein a frequency of each of the plurality of phases is less than a maximum frequency.

11. The circuit of claim 9, wherein a frequency of a driving clock is greater than the maximum frequency of the circuit.

12. The circuit of claim 2, wherein the plurality of mixers is a plurality of passive mixers.

13. The circuit of claim 2, wherein a gate of each of the plurality of mixers is shorted at its drain and at its source.

14. The circuit of claim 2, wherein the plurality of phases is equally spaced within a 360 degree phase space.

15. The circuit of claim 2, wherein the plurality of mixers, generates a plurality of outputs that are directed in the same direction, wherein each of the plurality of outputs is based on one of the plurality of phases.

16. The circuit of claim 15, wherein the plurality of outputs comprises one or more undesired outputs and one desired output based on the desired phase of the driving clock.

17. The circuit of claim 16, wherein the one or more undesired outputs combine to 0.

18. The circuit of claim 16, wherein the desired output is amplified.

* * * * *